United States Patent [19]

Ogawa

[11] Patent Number: 4,467,026
[45] Date of Patent: Aug. 21, 1984

[54] PROCESS FOR DRAWING PATTERNS WITH EXTREMELY FINE FEATURES IN THE PRODUCTION OF VLSI, LSI AND IC SYSTEMS

[75] Inventor: Kazufumi Ogawa, Osaka, Japan

[73] Assignee: Matsushita Electric Industrial Co., Ltd., Osaka, Japan

[21] Appl. No.: 459,627

[22] Filed: Jan. 20, 1983

[30] Foreign Application Priority Data

Jan. 20, 1982 [JP] Japan .................... 57-8129

[51] Int. Cl.$^3$ .............................. G03C 5/16
[52] U.S. Cl. .................... 430/296; 430/396; 430/966; 430/967; 430/273; 430/322; 427/43.1
[58] Field of Search ............... 430/296, 396, 966, 967, 430/273, 322; 427/43.1; 250/492.1

[56] References Cited

U.S. PATENT DOCUMENTS

| | | | |
|---|---|---|---|
| 4,018,938 | 4/1977 | Feder et al. | 427/43 |
| 4,267,259 | 5/1981 | Bohlen et al. | 430/296 |
| 4,301,237 | 11/1981 | Burns | 430/394 |

OTHER PUBLICATIONS

Zacharias, Conference: 1981 Proceedings of 4th Biennial University/Government/Industry Microelectrons Symposium, Starville, MS, U.S.A. (May 26-28, 1981), pp. II/10-420.

Lepsetter, M. P., Conference: International Electron Devices Meeting, Technical Digest, Washington, DC (Dec. 8-10, 1980), pp. 42-44.

*Primary Examiner*—John E. Kittle
*Assistant Examiner*—José G. Dees
*Attorney, Agent, or Firm*—Burgess, Ryan & Wayne

[57] ABSTRACT

In the patterning process in the fabrication of VLSI, LSI and IC systems, the electron beam is used to write a pattern over a resist layer on a wafer, but the resist layer is exposed by X-rays. More particularly, a finely focused beam of electrons writes a pattern on a thin metal film formed over a resin layer which in turn is formed over a wafer and the secondary X-rays; that is, the characteristics X-rays (such as Kα) emitted from the thin metal film when the electron beam strikes it, expose the resist layer which is sensitive to the X-rays, whereby a high degree of resolution can be obtained.

3 Claims, 6 Drawing Figures

PROCESS FOR DRAWING PATTERNS WITH EXTREMELY FINE FEATURES IN THE PRODUCTION OF VLSI, LSI AND IC SYSTEMS

BACKGROUND OF THE INVENTION

The present invention relates to a patterning process in the fabrication of VLSI, LSI and IC systems and more particularly a process capable of transferring the pattern with extremely fine features to the wafer surface.

The recent trend of semiconductor devices is toward increasingly higher densities. With conventional photolithography with ultraviolet light (of the wavelength of 300-400 nm), the highest obtainable resolution is limited to one micrometer and consequently the feature size is limited to 2-3 micrometers. In order to attain a resolution higher than can be achieved by photolithography, extensive research and development has been carried out in order to perfect the X-ray and electron beam lithography techniques, which use shorter wavelengths than photolithography.

Electron beam lithography uses a beam of charged electrons, so that it has an advantage of being capable of easily controlling the electron beam electrically. Therefore, a digital process can be used under the control of a computer to draw a pattern on a wafer. However, the emitted electrons are electrically charged so that when they strike a resist layer, they interact with molecules in the resist layer and consequently are scattered until they lose their energy and finally are trapped somewhere. Because of this scattering effect together with the back-scattering effect, the highest obtainable resolution is 0.1 micrometer.

In the case of X-ray lithography, X-rays are not electrically charged, so that the pattern features are distorted only by the secondary electrons emitted and scattered as a result of bombardment of nuclei in a resist material by the X-rays. X-ray lithography can, therefore, attain a high resolution of 0.01 micrometer. However, as described above, the X-rays are not electrically charged so that they cannot be electrically controlled and consequently the scanning exposure process used in electron beam lithography cannot be used for X-rays. It follows, therefore, that X-ray lithography requires specially designed masks. Masks for the X-ray lithography are prepared by forming a pattern in the form of an extremely thin film of gold or the like over the surface of a substrate of silicon or other high-molecular weight material.

As shown in FIG. 1, the thus prepared mask 1 is placed in an X-ray lithography device or machine comprising an exposure chamber 24 and an X-ray source chamber 23 with a target 21 and an electron gun 22. A wafer 2 which is supported on a wafer holder is spaced apart from the mask 1 by S (which is typically from 5 to 25 micrometers). The wafer 2 is exposed through the mask 1 with soft X-rays (0.2-1.5 nanometers in wavelength) emitted from the target 21. However, factors such as the diameter d of the target 21 or the initial diameter of the emitted beam of X-rays, the radiation angle $\theta$ and the spacing S between the wafer 2 and the mask 1 combine to give rise to undesired exposures; that is, distortions or blur $\delta$ to the edge profile of the beam.

SUMMARY OF THE INVENTION

The present invention was made to overcome the above and other problems encountered in electron beam and X-ray lithography and has for its object to provide a patterning process which combines (i) the advantage of electron beam lithography that a finely focused beam of electrons can be scanned over the wafer surface with (ii) the advantage of X-ray lithography that no scattering, which adversely affects the dimensional accuracy of pattern features, will occur as a result of bombardment of the wafer surface by the X-rays, whereby extremely fine pattern features can be well defined.

According to the present invention, a finely focused beam of electrons strike or scan a thin metal film formed over a resist layer which in turn is formed over the surface of a wafer so that the characteristic X-rays (for instance $K\alpha$) inherent to the thin metal film and emitted as a result of bombardment of the thin metal film by the electron beam expose the resist layer whereby a desired pattern can be transferred into the resist layer. Therefore, according to the present invention, the fabrication of high-density VLSI, LSI and IC systems can be much facilitated.

DETAILED DESCRIPTION OF THE PREFERRED EMBODIMENTS

Figure 1:
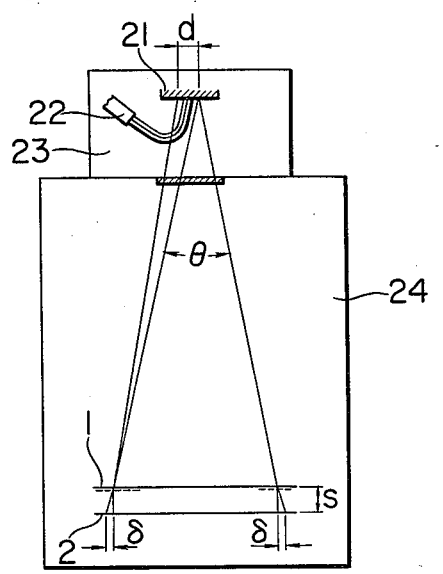
FIG. 1 shows schematically an X-ray lithography device.
Figure 2:
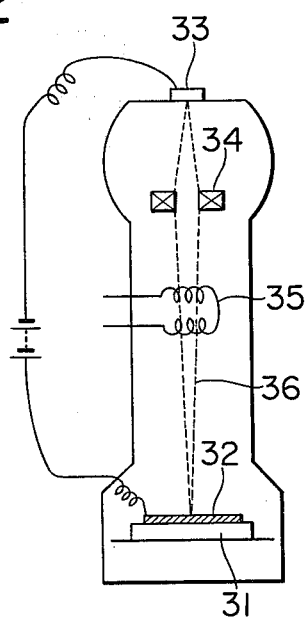
FIG. 2 shows schematically an electron beam-X-ray lithography device used in the present invention.

In FIG. 2 is shown in section an electron beam exposure device which is used in the present invention. A DC voltage is applied between a wafer 32 securely held on a wafer holder 31 and an electron beam source 33. An electron beam 36 passes through a blanking unit 34 and a scanning coil 35 so that the accelerated electron beam 36 scans the top surface of the wafer 32 to write a pattern.

Next, referring to FIG. 3, a process for writing a pattern with extremely fine features in accordance with the present invention will be described in detail. The top surface of the wafer 32 is coated with a film of X-ray sensitive resist 12 of 0.5-1 micrometer in thickness by means of a spinner or the like. The X-ray sensitive resist 12 may be a positive resist such as polymethyl methacrylate or a negative resist such as polybutadiene, polyvinyl ferrocene, polydiaryl-O-phthalate.

Figure 3A:
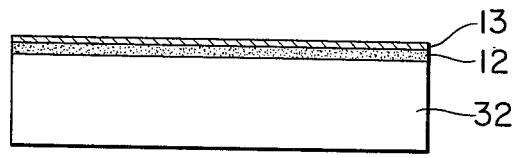
FIGS. 3A, 3B and 3C are views used to explain the steps of the patterning process in accordance with the present invention.

Thereafter, a thin metal film 13 of 500-1000 angstrom in thickness is grown over the surface of the resist 12 by a sputtering or electron-beam vacuum evaporation process (see FIG. 3A). The thin metal film 13 may be Au, Ag or Al.

Figure 3B:
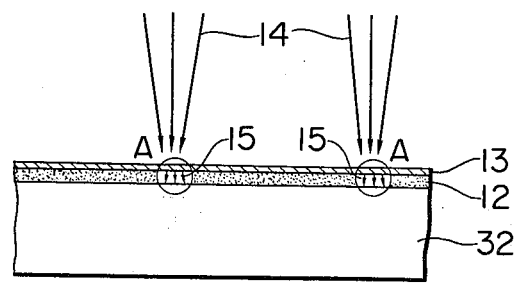

The next step is the scanning over the surface of the thin metal film 13 with a spot of accelerated electron beam 14 so that secondary X-rays 15 are emitted from local spots (see FIG. 3B). To this end, a DC bias is applied between the electron beam source 33 and the surface of the wafer 32 so that the electron beam 14 is accelerated. For instance, in the case of a thin gold film, the electron beam 14 is accelerated at 10-20 KeV so that characteristic X-rays 15 $L\alpha_1$ (128 Å) and $M\alpha_1$ (584

Å) of gold are locally emitted and consequently expose the X-ray sensitive resist 12 underlying the thin metal film 13.

Figure 3C:
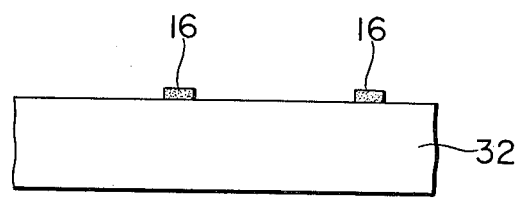

Thereafter, the thin metal film 13 is removed by etching and then the X-ray sensitive resist 12 is developed with a suitable developing solution so that a desired resist pattern 16 is obtained (see FIG. 3C).

Figure 4:
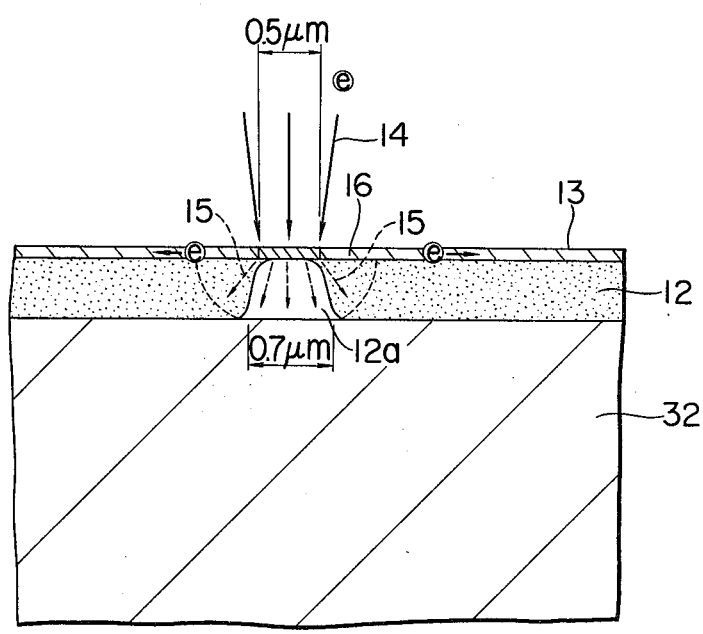
FIG. 4 is a partial view, on enlarged scale, corresponding to the portion A of FIG. 3B.

For instance, when the electron beam of $10^{-6}$ A is converged at the acceleration voltage of 20 KeV into a beam spot of 0.5 micrometers in diameter (with the area of about 0.2 square micrometers) as shown in FIG. 4, the output of the characteristic X-rays emitted due to the striking of the beam spot against the thin metal film 13 is of the order of $2 \times 10^{-4}$ W/$\mu m^2$. In the case of an X-ray sensitive resist film of epoxidated polybutadiene (EPB) of the thickness of 0.5 micrometers which is overcoated with a thin gold film 800 angstrom in thickness, the sensitivity of EPB is $10^{-12}$ J/$\mu m^3$, so that the exposure time is $1.25 \times 10^{-8}$ sec/$\mu m^2$. More particularly, in the case of a four-inch-diameter wafer (with the area of about 80 cm$^2$), the scanning exposure time is about 100 seconds. With a negative resist, the area which must be exposed is less than 10% of the whole area of the wafer so that the exposure time becomes less than 10 seconds. This exposure time is a satisfactory factor which gives a desired throughput in the IC wafer process.

In the case of the beam spot 0.5 micrometers in diameter as shown in FIG. 4, the emitted secondary X-rays are scattered about 0.5 micrometers beyond the edge of the beam spot, but the size of features in the pattern can be made of the order of 0.6–0.7 micrometers by suitably controlling the developing conditions. When the electron beam ⓔ strikes the thin metal film 13, the secondary X-rays are emitted and scattered as shown by the arrows so that the area or portion 12a remains as an element of a resist pattern. In this case, the electrons which strike the thin metal film 13 flows along it so that they are prevented from penetrating into the X-ray sensitive resist film 12. The secondary electrons given off when the electrons ⓔ strike the thin metal film 13 are substantially entrapped in the film 13 so that, unlike the conventional electron-beam lithography system, the distortions of the pattern may be avoided.

According to the conventional electron beam lithography, blur or distortions of the transferred pattern image occur, but according to the present invention such defects can be substantially eliminated. In addition, the electron beam or charged electrons can be converged into a spot and a desired pattern can be transferred by the beam spot scanning. Therefore, the process of the present invention is especially adapted for use in a system for drawing a pattern with a finely focused beam of electrons under the control of a computer in an X-ray sensitive resist over a wafer.

In the conventional electron beam lithography, a finely focused beam of electrons directly strikes a resist layer to draw a pattern, but according to the present invention, the beam spot strikes a thin metal film overlying an X-ray sensitive resist layer so that electrons flow through the thin metal film and consequently "charge-up" can be avoided. Therefore, a pattern with extremely fine features can be drawn.

Furthermore, according to the present invention, the use of a mask for exposing an X-ray sensitive resist can be eliminated and since the X-ray sensitive resist is exposed with the X-rays, a high degree of resolution can be attained.

In order to grow a thin metal film, Ag (K$\alpha$=0.56 Å), Cu (K$\alpha$=1.54 Å), Al (K$\alpha$=8.34 Å), Cr (K$\alpha$=2.29 Å) and Mo (K$\alpha$=0.71 Å) may be used. A high degree of efficiency can be attained if the acceleration voltage is selected two or three times the energies of K$\alpha$, L$\alpha_1$ and M$\alpha_1$.

As described above, the present invention combines the advantageous features of the X-ray and electron beam lithography systems so that the process of the present invention is especially advantageous in the fabrication of semiconductor ICs and especially high-density LSIs.

What is claimed is:

1. A process for forming a pattern having extremely fine features, comprising the steps of:
    coating one major surface of a wafer with a layer comprising a resist exposable by X-rays;
    overcoating the exposed surface of said resist layer with a thin metal film comprising a material which emits characteristic X-rays when bombarded with an electron beam of sufficient energy;
    exposing said resist layer by scanning the exposed surface of said thin metal film with a finely focused beam of electrons having sufficient energy to cause said thin film to emit said characteristic X-rays, whereby at least some of said characteristic X-rays impinge upon said resist layer to expose regions of said resist layer adjacent points where said finely focused beam of electrons impinges upon said thin metal film;
    removing said thin metal film; and
    developing said resist layer.

2. A process as defined in claim 1 wherein said wafer is made of a semiconductor material.

3. A process as defined in claim 1 wherein said metal thin film comprises gold.

* * * * *